US 12,378,669 B2

(12) United States Patent
Wang et al.

(10) Patent No.: US 12,378,669 B2
(45) Date of Patent: Aug. 5, 2025

(54) GROUND RETURN FOR THIN FILM FORMATION USING PLASMA

(71) Applicant: Applied Materials, Inc., Santa Clara, CA (US)

(72) Inventors: Teng Mao Wang, Tainan (TW); Cheng-Yuan Lin, Tainan (TW); Hsiang An, Taichung (TW)

(73) Assignee: APPLIED MATERIALS, INC., Santa Clara, CA (US)

( * ) Notice: Subject to any disclaimer, the term of this patent is extended or adjusted under 35 U.S.C. 154(b) by 609 days.

(21) Appl. No.: 17/701,553

(22) Filed: Mar. 22, 2022

(65) Prior Publication Data

US 2023/0243035 A1 Aug. 3, 2023

Related U.S. Application Data

(60) Provisional application No. 63/304,433, filed on Jan. 28, 2022.

(51) Int. Cl.
*C23C 16/458* (2006.01)
*C23C 16/513* (2006.01)

(52) U.S. Cl.
CPC .......... *C23C 16/458* (2013.01); *C23C 16/513* (2013.01)

(58) Field of Classification Search
USPC ........................................ 118/728–730, 500
See application file for complete search history.

(56) References Cited

U.S. PATENT DOCUMENTS

| 7,534,301 | B2 | 5/2009 | White et al. |
| 7,972,470 | B2 | 7/2011 | Furata et al. |
| 9,382,621 | B2 * | 7/2016 | Choi ................. H01J 37/32568 |
| 2010/0089319 | A1 | 4/2010 | Sorensen et al. |
| 2016/0305025 | A1 | 10/2016 | Choi et al. |

FOREIGN PATENT DOCUMENTS

| KR | 102045873 B1 | 11/2019 |
| WO | 2017221829 A1 | 12/2017 |
| WO | 2021158450 A1 | 8/2021 |

OTHER PUBLICATIONS

International Search Report, dated May 19, 2023, for PCT Application No. PCT/US2023/011044.

* cited by examiner

*Primary Examiner* — Yewebdar T Tadesse
(74) *Attorney, Agent, or Firm* — Patterson + Sheridan, LLP

(57) ABSTRACT

A process kit is provided. The process kit includes: a substrate support; and one or more electrical connectors, each electrical connector attached to the substrate support, each electrical connector including: a tube; a shaft including a rim, the rim positioned inside the tube, the shaft including a first portion above the rim and a second portion below the rim, wherein at least part of the first portion is configured to move outside of the tube, and the second portion is inside the tube; and a seal, wherein the rim directly underlies at least a portion of the seal.

17 Claims, 5 Drawing Sheets

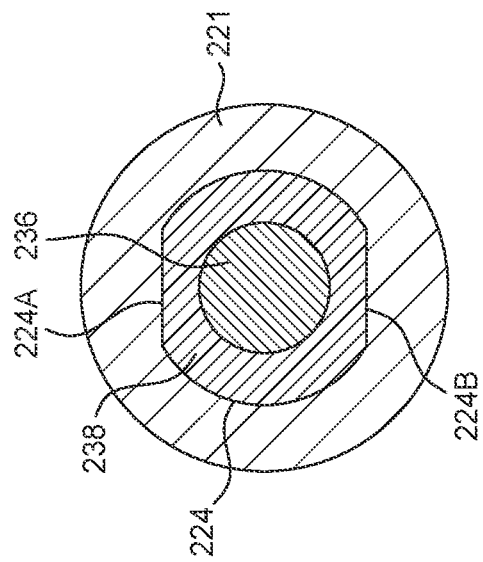
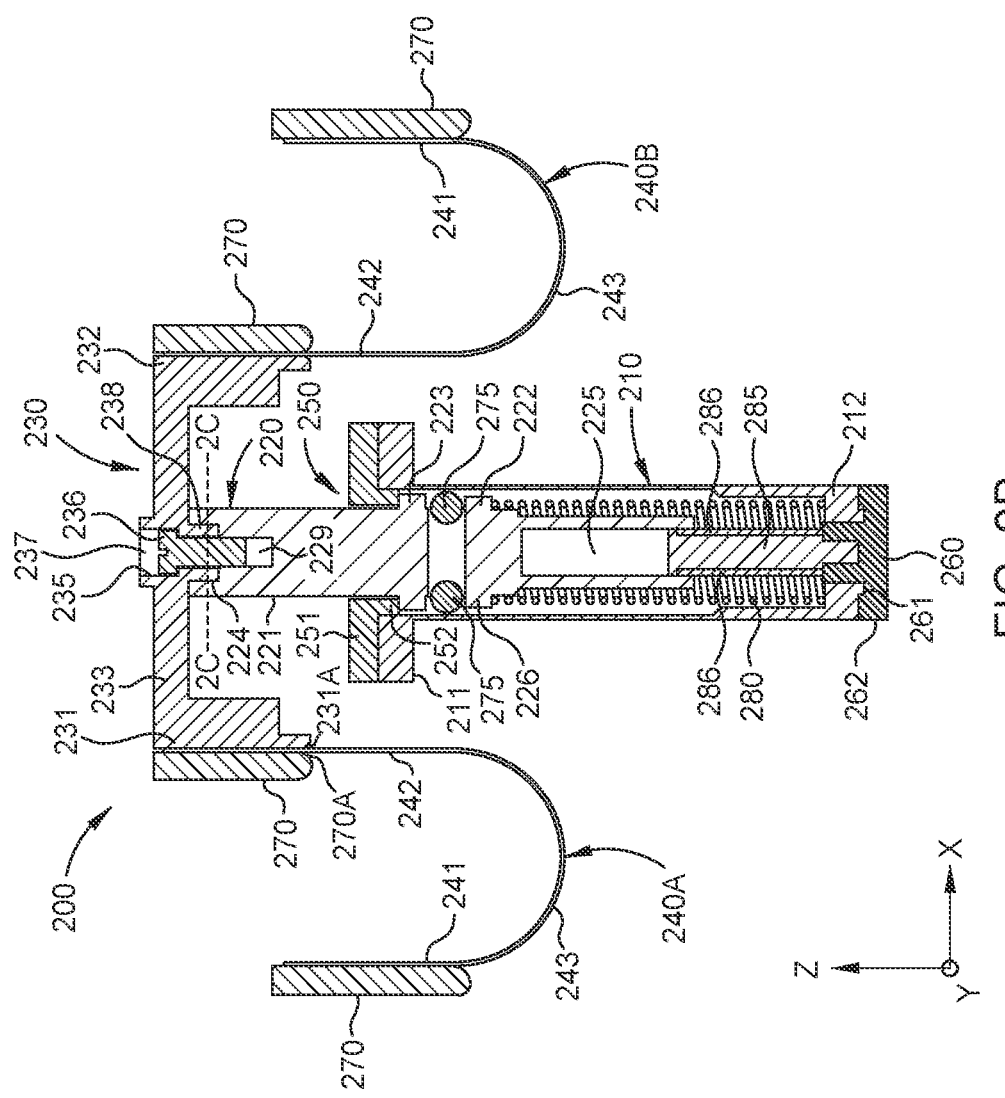

GROUND RETURN FOR THIN FILM FORMATION USING PLASMA

CROSS-REFERENCE TO RELATED APPLICATIONS

This application claims the benefit of U.S. Provisional Patent Application No. 63/304,433, filed on Jan. 28, 2022, the contents of which are herein incorporated by reference.

BACKGROUND

Field

Embodiments described herein generally relate to methods and apparatus for processing large area substrates using plasma. More particularly, embodiments described herein relate to a modulated radio frequency (RF) current return path for a plasma processing chamber.

Description of the Related Art

Plasma enhanced chemical vapor deposition (PECVD) is generally employed to deposit thin films on substrates, such as semiconductor substrates, solar panel substrates, and liquid crystal display (LCD) and organic light emitting diode (OLED) substrates used in display manufacture. PECVD is generally accomplished by introducing a precursor gas into a vacuum chamber having a substrate disposed on a susceptor or substrate support. The precursor gas is typically directed through a gas distribution plate situated near the top of the vacuum chamber. The precursor gas in the vacuum chamber is energized (e.g., excited) into a plasma by applying a radio frequency (RF) power to the chamber from one or more RF sources coupled to the chamber. The excited gas reacts to form a thin film of material on a surface of the substrate (or devices formed thereon). The gas distribution plate is generally connected to a RF power source and the susceptor is typically connected to the chamber body providing a RF current return path.

In the manufacture of OLED devices, PECVD process are generally used to form a thin film on a plurality of OLED devices formed on a substrate. The thin film is utilized to encapsulate and/or hermetically seal the devices (known as thin film encapsulation (TFE)). Uniformity is generally desired in these thin films deposited on the OLED devices using PECVD processes. When the thin films are not uniform across the substrate area, the yield may be decreased. It has been found that the non-uniformity is related to plasma density uniformity, which is affected by RF return. Furthermore, particle generation inside process chambers can lead to particles landing on substrates, which can lower process yield. Therefore, equipment added to process chambers should not contribute significantly to particle generation. Additionally, the equipment added to process chambers should not make a significant contribution to equipment downtime for maintenance and replacement.

Therefore, what is needed is an improved RF return scheme for large area substrates that does not cause the problems associated with particle generation and equipment downtime mentioned above.

SUMMARY

Embodiments of the disclosure generally relate to a method and apparatus for plasma processing a substrate. More particularly, embodiments of described herein provide a plasma processing chamber having one or more radio frequency (RF) grounding or return devices adapted to provide an advantageous RF return path.

In one embodiment, a process kit is provided. The process kit includes: a substrate support; and one or more electrical connectors, each electrical connector attached to the substrate support, each electrical connector comprising: a tube; a shaft including a rim, the rim positioned inside the tube, the shaft including a first portion above the rim and a second portion below the rim, wherein at least part of the first portion is configured to move outside of the tube, and the second portion is inside the tube; and a seal, wherein the rim directly underlies at least a portion of the seal.

In another embodiment, a process kit is provided. The process kit includes a substrate support; and one or more electrical connectors, each electrical connector attached to the substrate support, each electrical connector comprising: a tube; a shaft including a first portion and a second portion, wherein the first portion is outside of the tube and the second portion is inside the tube; and a first bendable portion including a first section and second section, wherein the first section and the second section are substantially vertical the first section is connected to the substrate support and the second section is connected to the shaft, and the first section is configured to move relative to the second section when the shaft moves relative to the substrate support.

In another embodiment, a process kit is provided. The process kit includes a substrate support; and one or more electrical connectors, each electrical connector attached to the substrate support, each electrical connector comprising: a tube; a shaft including a rim, the rim positioned inside the tube, the shaft including a first portion above the rim and a second portion below the rim, wherein at least part of the first portion is configured to move outside of the tube, and the second portion is inside the tube; a seal, wherein the rim directly underlies at least a portion of the seal; and a first bendable portion including a first section and a second section, wherein the first section and the second section are substantially vertical, the first section is connected to the substrate support, the second section is connected to the shaft, and the first section is configured to move relative to the second section when the shaft moves relative to the substrate support.

BRIEF DESCRIPTION OF THE DRAWINGS

So that the manner in which the above recited features of the disclosure can be understood in detail, a more particular description as described herein, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2B is a cross-sectional side view of the electrical connector shown in FIG. 2A, according to one embodiment.

FIG. 2C is a cross-sectional top view of the components in the electrical connector along reference line 2C from FIG. 2B, according to one embodiment.

Figure 1A:
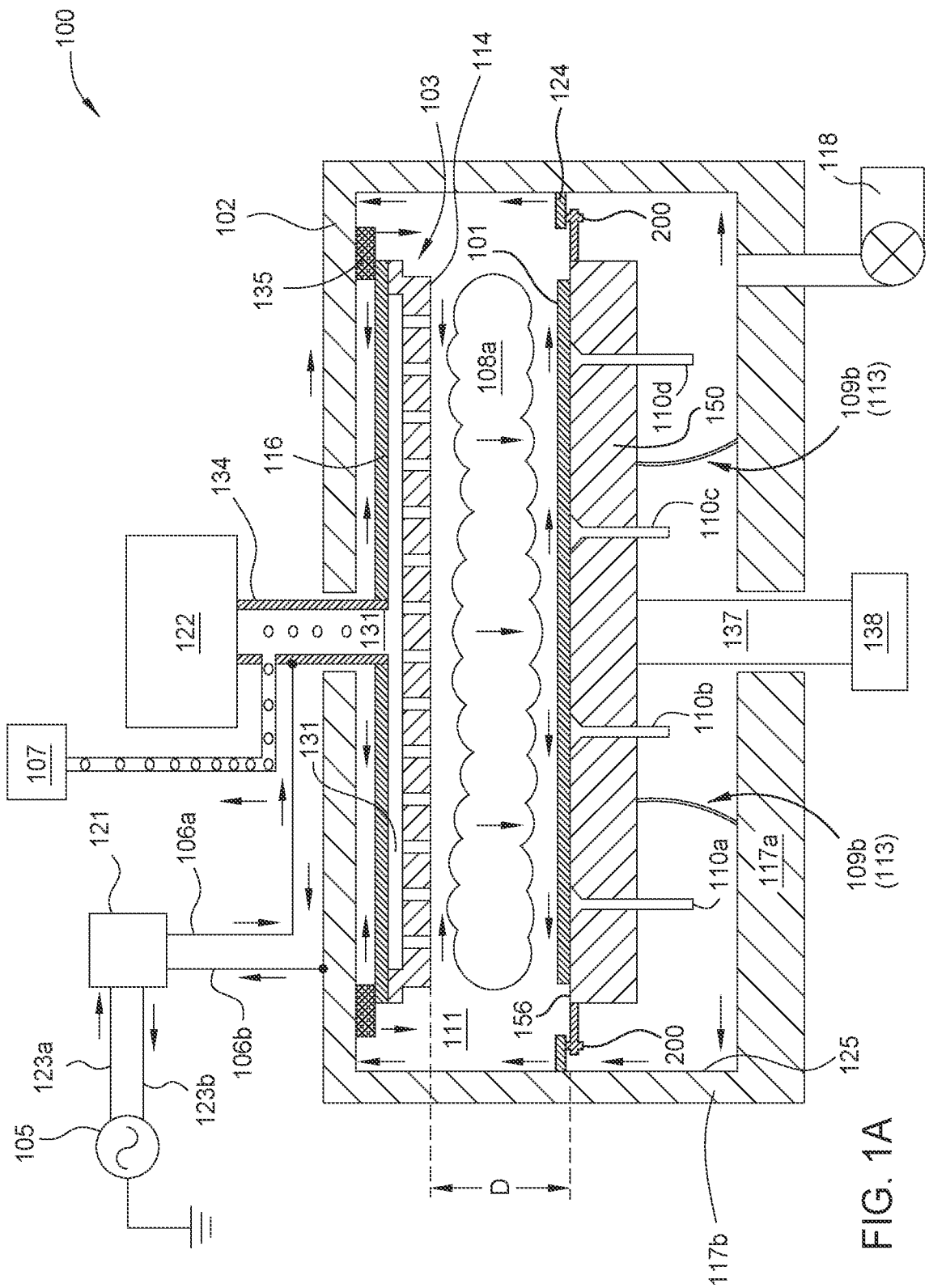
FIG. 1A is a schematic cross-sectional view of one embodiment of a plasma processing system, according to one embodiment.

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

Embodiments of the present disclosure generally relate to a method and apparatus for processing substrates using plasma and/or cleaning components using plasma. A process kit is disclosed which includes a susceptor having various grounding devices coupled thereto to enable a radio frequency (RF) return path. Embodiments described herein relate to methods of enhancing plasma formation and depositing materials onto a substrate by providing an improved ground or return path for electrical current. In the description that follows, reference will be made to a plasma enhanced chemical vapor deposition (PECVD) chamber, but it is to be understood that the embodiments herein may be practiced in other chambers as well, including physical vapor deposition (PVD) chambers, etching chambers, semiconductor processing chambers, solar cell processing chambers, and organic light emitting display (OLED) processing chambers to name only a few. Suitable chambers that may be used are available from AKT America, Inc., a subsidiary of Applied Materials, Inc., Santa Clara, California. It is to be understood that the embodiments discussed herein may be practiced in chambers available from other manufacturers as well.

The present disclosure may be utilized for processing substrates of any size or shape. However, the present disclosure provides particular advantage in substrates having a plan surface area of about 15,600 cm$^2$ and including substrates having a plan surface area of about a 90,000 cm$^2$ surface area (or greater). The increased size of the substrate surface area presents challenges in uniform processing due to the increased difficulty in providing a suitable ground path. Embodiments described herein provide a solution to these challenges during processing of the larger substrate sizes.

FIG. 1A is a schematic cross-sectional view of one embodiment of a plasma processing system 100, according to one embodiment. The plasma processing system 100 is configured to process a large area substrate 101 using plasma in forming structures and devices on the large area substrate 101 for use in the fabrication of liquid crystal displays (LCD's), flat panel displays, organic light emitting diode (OLED) devices, or photovoltaic cells for solar cell arrays. The substrate 101 may be a thin sheet of metal, plastic, organic material, silicon, glass, quartz, or polymer, among others suitable materials. The plasma processing system 100 may be configured to deposit a variety of materials on the large area substrate (e.g., substrate 101), including but not limited to dielectric materials (e.g., $SiO_2$, $SiOxN_y$, derivatives thereof or combinations thereof), semiconductive materials (e.g., Si and dopants thereof), or barrier materials (e.g., $SiN_x$, $SiO_xN_y$, or derivatives thereof). Specific examples of dielectric materials and semiconductive materials that are formed or deposited by the plasma processing system 100 onto the large area substrates may include epitaxial silicon, polycrystalline silicon, amorphous silicon, microcrystalline silicon, silicon germanium, germanium, silicon dioxide, silicon oxynitride, silicon nitride, dopants thereof (e.g., B, P, or As), derivatives thereof or combinations thereof. The plasma processing system 100 is also configured to receive gases such as argon, hydrogen, nitrogen, helium, or combinations thereof, for use as a purge gas or a carrier gas (e.g., Ar, $H_2$, $N_2$, He, derivatives thereof, or combinations thereof). One example of depositing silicon thin films on the large area substrate 101 using the system 100 may be accomplished by using silane as a processing gas along with a hydrogen carrier gas.

Figure 1B:
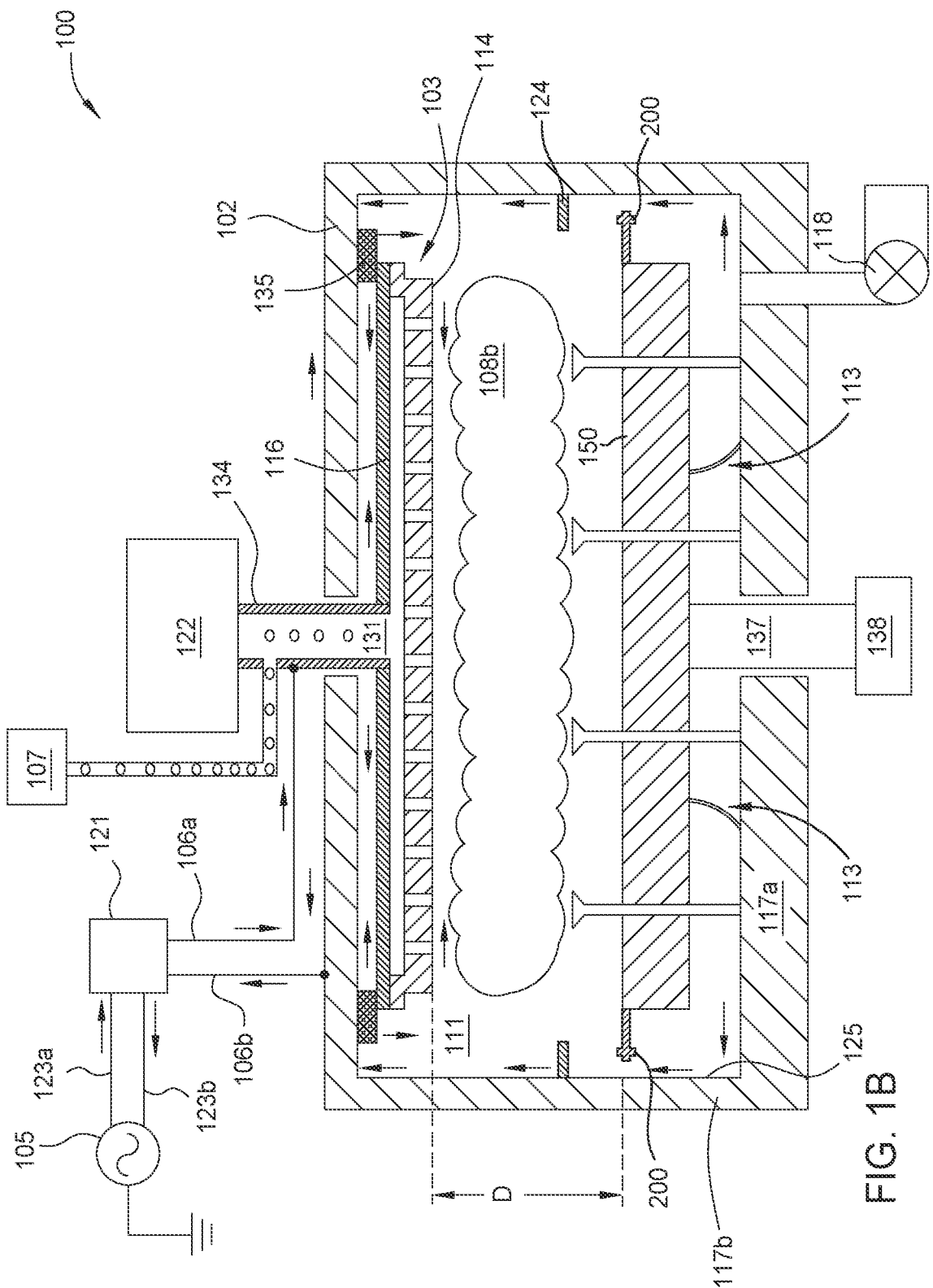
FIG. 1B is a schematic cross-sectional view of the plasma processing system shown in FIG. 1A, according to one embodiment.

As shown in FIG. 1A, the plasma processing system 100 generally comprises a chamber body 102 including a bottom 117a and one or more sidewalls 117b that at least partially define a processing volume 111. A substrate support 150 (also referred to as susceptor) is disposed in the processing volume 111. The substrate support 150 is adapted to support the substrate 101 on a top surface 156 of the substrate support 150 during processing. The substrate support 150 is coupled to an actuator 138 by a shaft 137. The actuator is configured to move the substrate support 150 at least vertically to (1) facilitate transfer of the substrate 101 into and out of the chamber body 102 and/or (2) adjust a distance D between the substrate 101 and a showerhead assembly 103. One or more lift pins 110a-110d may extend through the substrate support 150. The lift pins 110a-110d are adapted to contact the bottom 117a of the chamber body 102 and support the substrate 101 above the top surface 156 of the substrate support 150 when the substrate support 150 is lowered by the actuator 138 in order to facilitate transfer of the substrate 101, for example using the position of the substrate support 150 as shown in FIG. 1B. In a processing position as shown in FIG. 1A, the lift pins 110a-110d are adapted to be flush with or slightly below the top surface 156 of the substrate support 150 to allow the substrate 101 to lie flat on the substrate support 150.

In some embodiments, the substrate 101 and the substrate support 150 may have a surface area greater than about 5 square meters, such as about 5.5 square meters, or greater. In some embodiments, the substrate 101 and/or the substrate support 150 can be rectangular and can include dimensions of about 2200 mm on a minor side by about 2500 mm on a major side, or greater. In other embodiments the substrate and substrate support 150 can be smaller. The structures formed on the substrate 101 may be OLED devices, thin film transistors or p-n junctions to form diodes for photovoltaic cells.

The showerhead assembly 103 is configured to supply a processing gas to the processing volume 111 from a processing gas source 122. The plasma processing system 100 also includes an exhaust system 118 configured to apply negative pressure to the processing volume 111. The showerhead assembly 103 is generally disposed opposing the substrate support 150, for example directly above the substrate support 150, in a substantially parallel relationship.

In one embodiment, the showerhead assembly 103 comprises a gas distribution plate 114 and a backing plate 116. The backing plate 116 may function as a blocker plate to enable formation of a gas volume 131 between the gas distribution plate 114 and the backing plate 116. The gas source 122 is connected to the gas distribution plate 114 by a conduit 134. In one embodiment, a remote plasma source 107 is coupled to the conduit 134 for supplying a plasma of activated gas through the gas distribution plate 114 to the processing volume 111. The plasma from the remote plasma source 107 may include activated gases (e.g., fluorine) for cleaning chamber components disposed in the processing volume 111.

The gas distribution plate 114, the backing plate 116, and the conduit 134 are generally formed from electrically conductive materials and are in electrical communication with one another. The chamber body 102 is also formed from an electrically conductive material. The chamber body 102 is generally electrically insulated from the showerhead assembly 103. In one embodiment, the showerhead assembly 103 can be suspended below a top of the chamber body 102 by attaching the showerhead assembly 103 to an insulator 135 that electrically separates the showerhead assembly 103 from the chamber body 102.

In one embodiment, the substrate support 150 is also electrically conductive. The electrically conductive substrate support 150 and the showerhead assembly 103 can be configured as opposing electrodes for generating a plasma 108a between the substrate support 150 and the showerhead assembly 103 during processing and/or a pre-treatment or post-treatment process. Additionally, the substrate support 150 and the showerhead assembly 103 may also be utilized to support a plasma 108b (FIG. 1B) of cleaning gases during a cleaning process.

The plasma processing system 100 can include a radio frequency (RF) power source 105 that can be used to generate the plasma 108a between the showerhead assembly 103 and the substrate support 150 before, during and after processing. The RF power source 105 may also be used to maintain energized species or further excite cleaning gases supplied from the remote plasma source 107. The RF power source 105 can be coupled to the showerhead assembly 103 to supply RF power for generating the plasma. The RF power source 105 can also be connected to the chamber body 102 to allow for a return path for the RF circuit. The RF power source can make these corresponding connections to the showerhead assembly 103 and to the chamber body through an impedance matching circuit 121

In one embodiment, the plasma processing system 100 can includes a plurality of electrical connectors 200 and a plurality of electrical connectors 113. Each of the electrical connectors 200, 133 are coupled between the substrate support 150 and the chamber body 102, which can be used as the ground connection for the RF power source 105. In some embodiments, the electrical connectors 113 can be omitted.

Each of the electrical connectors 200 may also be referred to as side grounding device. Each of the electrical connectors 200 are configured to selectively contact and/or provide a ground path between a side of the substrate support 150 and the chamber sidewall 117b of the grounded chamber body 102. Additionally, each of the electrical connectors 113 may be referred to as bottom grounding devices. Each of the electrical connectors 113 are configured to provide a return path between the substrate support 150 and the chamber bottom 117a of the grounded chamber body 102. In some embodiments, each of the electrical connectors 200 are coupled to an extension (see e.g., first extension 151 of FIG. 2A) that is electrically coupled to the substrate support 150.

The plasma processing system 100 further includes a plurality of ledges 124 that each extend inwardly into the processing volume 111 from the sidewall 117b of chamber body 102. Each ledge 124 is electrically conductive, so that the ledge can serve as an electrical connection between the chamber body 102 and the electrical connectors 200. Each of the electrical connectors 200 is positioned to contact one of the ledges 124 when the substrate support 150 is raised to the position of the substrate support 150 shown in FIG. 1A. As described in further detail below, when the substrate support 150 moves to the position shown in FIG. 1B, each of the electrical connectors 200 no longer contacts one of the ledge 124, so that the electrical connectors 200 do not serve as a ground connection when the substrate support 150 is lowered to the position shown in FIG. 1B.

One embodiment of an RF current path during substrate processing is schematically illustrated by arrows in FIG. 1A. The RF current generally travels from a first lead 123a of the RF power source 105 to a first output 106a of the impedance matching circuit 121, then travels along an outer surface of the conduit 134 to a back surface of the backing plate 116, and then to a front surface of the gas distribution plate 114. From the front surface of the gas distribution plate 114, the RF current goes through plasma 108a and reaches a top surface of the substrate 101 or the substrate support 150, then through the side grounding devices 200 and/or the bottom electrical connectors 113 to an inner surface 125 of the chamber body 102. From the inner surface 125, the RF current returns to the to a second lead 123b of the RF power source 105 after going through a connection 106b to the impedance matching circuit 121.

In one embodiment, the return path of the RF current during processing may be dependent on a spacing between the substrate support 150 and the showerhead assembly 103, which is depicted as a distance D. The spacing of this distance D is controlled by the elevation of the substrate support 150. In one embodiment, the distance D can be between about 200 mils to about 2000 mils during processing, and different distances D can be used for different processes or when cleaning is performed. At the spacing D shown in FIG. 1A, the electrical connectors 200 and the electrical connectors 113 may both remain electrically coupled to the RF power source 105. In this embodiment, the RF return path taken by the RF current may be based on the electrical properties and positioning of the electrical connectors 200, 113 with some of these properties including resistance, impedance and/or conductance of the connectors 200, 113.

FIG. 1B is a schematic cross-sectional view of the plasma processing system 100 shown in FIG. 1A, according to one embodiment. In FIG. 1B, the plasma processing system 100 is shown without a substrate to depict a chamber cleaning procedure, and arrows are shown to schematically depict RF current flow. In this embodiment, energized cleaning gases are flowed to the showerhead assembly 103 and the processing volume 111 from the remote plasma source 107 to supply a plasma 108b within the processing volume 111. During chamber cleaning, the substrate support 150 is displaced away from the showerhead assembly 103 and RF power from the RF power source 105 may be applied to the processing volume 111 to maintain or further energize the cleaning gas from the remote plasma source 107. In one embodiment, the spacing or distance D of the substrate support 150 relative to the showerhead assembly 103 during chamber cleaning is greater than the spacing or distance D of the substrate support 150 relative to the showerhead assembly 103 during processing (e.g., deposition), for example as shown in FIG. 1A. In one embodiment, the distance D between the substrate support 150 and the showerhead assembly 103 during a cleaning process is between about 200 mils to about 5000 mils, or greater.

In FIG. 1B, the electrical connectors 200 are each moved away from the ledges 124, so that the electrical connectors 200 are electrically disconnected from the chamber body 102. This electrical separation results in causing the returning RF current to flow solely through the electrical connectors 113.

Figure 2A:
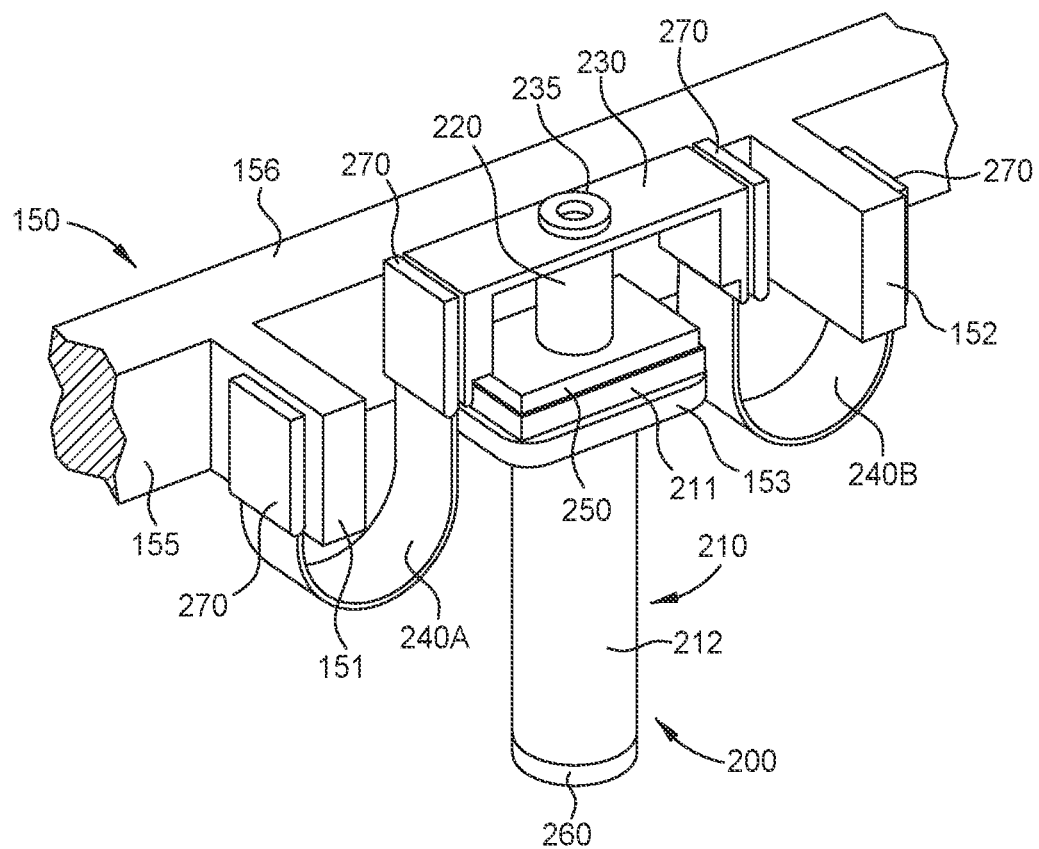
FIG. 2A is a perspective view of one of the electrical connectors of FIG. 1B attached to the substrate support of FIG. 1B, according to one embodiment.

FIG. 2A is a perspective view of one of the electrical connectors 200 attached to the substrate support 150, according to one embodiment. The substrate support 150 includes a sidewall 155 and the top surface 156. The electrical connector 200 is mechanically and electrically connected to the sidewall 155 of the substrate support 150. In some embodiments, the electrical connector 200 may also or alternatively be connected to a top or bottom of the substrate support 150.

The substrate support 150 includes a first extension 151, a second extension 152, and a support plate 153. The first extension 151, the second extension 152, and the support plate 153 each extend outwardly from the sidewall 155 of the substrate support 150 in a direction towards the sidewall 117b of the chamber body 102 (see FIG. 1A). The electrical connector 200 can be attached to each of the first extension 151, the second extension 152, and the support plate 153. The electrical connector 200 can include mounting plates 270, which can be used to attach the electrical connector 200 to the first extension 151 and the second extension 152, for example using fasteners (not shown).

The electrical connector 200 further includes a contactor 230 that can be used to make the electrical connection to the sidewall 117b of the chamber body 102 through the ledge 124 (see e.g., FIG. 1A). The contactor 230 can be formed of a conductive material (e.g., a metal). The contactor 230 includes a first leg 231, a second leg 232, a top 233, and an elevated portion 235. The top 233 can connect the first leg 231 with the second leg 232. The first leg 231 and the second leg 232 can extend downwardly in a first direction (i.e., downwardly in FIG. 2B) from the top 233. The elevated portion 235 can extend in a second direction (i.e., upwardly in FIG. 2B) from the top 233. The elevated portion 235 can make mechanical and electrical contact with the ledge 124 (see FIG. 1A), for example when the substrate support 150 is in the processing position shown in FIG. 1A. Because the ledge 124 is electrically connected to the sidewall 117b of the chamber body 102, this contact between the elevated portion 235 and the ledge 124 allows RF current from the RF power source 105 to flow between the substrate support 150 and the sidewall 117b of the chamber body 102, which may be connected to electrical ground for the RF power source 105.

The electrical connector 200 further includes a shaft 220 and a tube 210. The tube 210 can include a top rim 211 and a tube body 212 (see also FIG. 2B). The top rim 211 can be positioned on and mounted to the support plate 153 of the substrate support 150, for example using fasteners (not shown). The support plate 153 can include an opening (e.g., a central opening) that allows the tube body 212 to be inserted through the opening while the top rim 211 is supported by the support plate 153 of the substrate support 150. The shaft 220 can extend from outside the tube 210 into the tube 210 through the opening in the top rim 211 of the tube 210. As described in fuller detail below, the lower portion of the shaft 220 inside the tube 210 can be coupled to a spring 280 (see FIG. 2B) that provides an upward force to the contactor 230 through the shaft 220 to ensure the elevated portion 235 of the contactor 230 maintains constant electrical contact with the ledge 124 when the substrate support 150 is in the processing position as shown in FIG. 1A.

The electrical connector 200 further includes a top seal 250. The top seal 250 may also be referred to as a top cover.

The top seal 250 can be positioned over the top rim 211 of the tube 210. As described in fuller detail below, the top seal 250 can be used to seal the opening of the tube 210 located at the top rim 211 while still allowing the shaft 220 to slide through the opening at the top of the tube 210. Sealing the interior of the tube 210 with the top seal 250 can help reduce the number of particles generated inside the tube 210 by reducing the exposure to plasma of the components inside the tube 210, such as the spring 280 shown in FIG. 2B. The top seal 250 can be mounted to the top rim 211, for example by using fasteners (not shown). Additional detail on the top seal 250 is provided below in reference to FIG. 2B.

The electrical connector 200 can further include a bottom cover 260. The bottom cover 260 can be positioned at the bottom of the tube 210. The bottom cover 260 can be mounted to the bottom of tube 210, for example using fasteners (not shown). The bottom cover 260 can include an outer side surface 262. The bottom cover 260 can further include a step 261 as the bottom cover 260 extends inwardly from the outer side surface 262. The step 261 can be pressed against corresponding feature on the bottom of the tube body 212. The step 261 and the corresponding feature on the bottom of the tube body 212 can help reduce the likelihood and frequency of plasma (e.g., a fluorine-containing plasma) from entering the interior of the tube 210 through a location at the bottom of the tube 210.

The electrical connector 200 further includes a first bendable portion 240A and a second bendable portion 240B. The bendable portions 240A, 240B can also be referred to as ground straps due to their use for serving as a ground connection for the RF power provided by the RF power source 105 (see FIG. 1A). The first bendable portion 240A and the second bendable portion 240B can be used to provide the electrical connection between the substrate support 150 and the contactor 230. The first bendable portion 240A is mounted (e.g., fastened) to the first leg 231 of the contactor 230 and to the first extension 151 of the substrate support 150, for example using the mounting plates 270 as shown and fasteners (not shown). The second bendable portion 240B is mounted (e.g., fastened) to the second leg 232 of the contactor 230 and to the second extension 152 of the substrate support 150, for example using mounting plates 270 as shown and fasteners (not shown).

FIG. 2B is a cross-sectional side view of the electrical connector 200, according to one embodiment. The electrical connector 200 in FIG. 2B is shown unattached to the substrate support 150. In FIG. 2B, the interior of the tube 210 is exposed, so that additional detail of the electrical connector 200 can be described. The electrical connector 200 further includes a spring 280. The spring 280 contracts when a downward pressure is applied to the shaft 220, and the spring 280 extends when a downward pressure on the shaft 220 is removed.

As explained in further detail below, in FIG. 2B, the spring 280 is extended causing the contactor 230 to have the position the contactor 230 has during a chamber cleaning process, for example as described in reference to FIG. 1B. The spring 280 can also be compressed when the elevated portion 235 of the contactor 230 contacts the ledge 124 when the substrate support 150 is in the processing position shown in FIG. 1A. The spring 280 can also be compressed to intermediate positions when the substrate support 150 is at a position lower than the processing position of FIG. 1A but still in a position at which the elevated portion 235 of the contactor 230 contacts the ledge 124 with at least some pressure.

The spring 280 is mechanically coupled with the shaft 220. For example, the shaft 220 can include a protrusion 226 (e.g., a rim) that contacts the top of the spring 280. This mechanical coupling enables a downward force on the on the shaft 220 to cause a compression of the spring 280, which allows the shaft 220 to slide further into the tube 210. For example, when the substrate support 150 moves upward to the processing position of FIG. 1A, the elevated portion 235 of the contactor 230 contacts the ledge 124 resulting in a downward force on the shaft 220 and a corresponding compression of the spring 280. Then when the substrate support 150 moves downward from the processing position of FIG. 1A, the elevated portion 235 of the contactor 230 moves away from the ledge 124, for example to the cleaning position in FIG. 1B. This movement of the elevated portion 235 of the contactor 230 away from the ledge 124 results in a removal of the downward force on the contactor 230 and the shaft 220, which results in a relaxation and extension of the spring 280 to the position as shown here in FIG. 2B. The extension of the spring 280 results in a corresponding rising of the shaft 220 and the contactor 230 to position also shown here in FIG. 2B.

The shaft 220 includes a rim 223 that is positioned inside the tube 210. In some embodiments, the rim 223 extends for 360 degrees, so that the rim 223 can form a seal with the top seal 250 as described in fuller detail below. The shaft 220 includes a first portion 221 located above the rim 223. The shaft 220 includes a second portion 222 that is located below the rim 223.

The second portion 222 includes a tubular portion 225. The electrical connector 200 further includes a rod 285 (e.g., a cylindrical support) positioned inside the tube 210. The rod 285 can be placed entirely inside the tube 210, which can help to reduce or eliminate particles from inside the tube 210 leaving through the bottom of the tube 210. The rod 285 can extend vertically from the bottom of the tube body 212. In some embodiments, the rod 285 can extend from the bottom cover 260. In some embodiments, one or more supports 286 can be attached to and/or surround the rod 285 to provide additional structural support. The tubular portion 225 can slide down and around the rod 285 and supports 286 when the spring 280 is compressed. The rod 285 can help prevent the shaft 220 from any significant tilting in any direction when the spring 280 is compressed and relaxed. In some embodiments, the supports 286 can be formed of a ceramic having a low surface roughness.

The rim 223 of the shaft 220 has a larger cross-sectional area in the XY plane than the opening in the top seal 250 that allows some of the first portion 221 to slide into and out of the tube 210 past the top seal 250. Thus, the rim 223 of the shaft 220 cannot slide out of the tube 210 and past the top seal 250. Similarly, at least part of the first portion 221 is smaller (e.g., slightly smaller) than the opening in the top seal 250, so that the shaft 220 can extend and retract when the spring 280 moves. Although described as part of the shaft 220, in some embodiments the rim 223 can be a separate component attached to a shaft that is otherwise similar to the shaft 220. In some embodiments, all of the first portion 221 of the shaft 220 can be configured to move inside the tube 210 when the spring 280 is contracted, for example if a seal similar to the seal 250 was alternatively placed inside a tube similar to tube 210 instead of outside the tube.

The top seal 250 includes an outer rim 251 and an inner ring 252. The inner ring 252 extends below the outer rim 251. The outer rim 251 of the top seal 250 can be positioned on the top rim 211 of the tube 210. The outer rim 251 can be secured to the top rim 211, for example by using fasteners (not shown). The inner ring 252 of the top seal 250 extends down into the opening of the top rim 211 of the tube 210. The rim 223 of the shaft 220 can directly underlie a portion of the top seal 250, such as the inner ring 252 of the top seal 250.

The rim 223 of the shaft 220 can contact the inner ring 252 when the spring 280 extends to the position shown in FIG. 2B. For example, the top surface of the rim 223 can contact the bottom surface of the inner ring 252. This contact between the rim 223 of the shaft 220 and the inner ring 252 of the top seal 250 can function as a barrier that prevents plasma from entering the inside of the tube 210 when the spring 280 is extended, for example to the position shown in FIG. 2B which could be done during a cleaning process, such as the cleaning process described above during FIG. 1B. Cleaning processes often use highly aggressive radicals (e.g., fluorine radicals), which can generate particles inside the tube 210 if the cleaning plasma reaches the inside of the tube 210. Thus, the barrier created by the contact of the inner ring 252 of the top seal 250 with the top surface of the rim 223 of the shaft 220 can reduce the amount of particles generated inside the tube 210.

This contact between the rim 223 of the shaft 220 and the inner ring 252 of the top seal 250 can also help reduce the number of particles inside the tube 210 that can leave the tube 210 to reach other regions inside the chamber body 102, such as regions above the substrate support 150. Particles can be generated inside the tube 210 from movement of mechanical components (e.g., movement of the shaft 220 and the spring 280) as well as when plasma finds its way into the interior of the tube 210, for example during a cleaning process. The contact between the rim 223 of the shaft 220 and the inner ring 252 of the top seal 250 can help reduce the exposure of components inside the tube 210 to the plasma generated in a process (e.g., a fluorine plasma cleaning process), such as the cleaning process described in reference to FIG. 1B. When components inside the tube 210, such as the spring 280, are exposed to plasma (e.g., a cleaning plasma including fluorine radicals), particles can be generated. These generated particles can then eventually end up at other locations inside the chamber and onto substrates being processed, such as the substrate 101 shown in FIG. 1A. When these particles end up on substrates, product yield can be lowered. Furthermore, once product yield is lowered from particles escaping from the electrical contactors, it is likely that the electrical contactors need to be replaced, which results in significant downtime. Thus, by having the spring 280 push the rim 223 of the shaft 220 to press against the inner ring 252 of the top seal 250 during a cleaning process, the number of particles generated in the tube 210 can be substantially reduced, and the problems mentioned above can be reduced or eliminated.

In some embodiments, a seal similar to top seal 250 can be positioned at other locations, which can generate the same results of creating a seal at the top of the tube (e.g., tube 210) when the spring 280 is extended. For example, in another embodiment, a seal can also be placed more inside the tube or entirely inside the tube. For example, in one embodiment, the tube could alternatively include an inner ring, for example extending from the interior sidewalls of the tube, and a seal could be placed beneath and against the inner ring, so that the rim 223 engages the seal when the spring 280 extends to cause the contact between the rim 223 and this alternatively placed seal. In another embodiment, a seal could be placed on the rim 223 and this movable seal could press against an inner ring extending from the sidewalls of the tube at a location near the top of the tube when the spring 280 fully extends to cause this contact. Like the embodiment shown in FIG. 2B, each of these alternative embodiments described can create a seal at the top of the tube when the spring extends to a position to cause contact that generates a seal, such as when the rim 223 contacts the seal 250 in FIG. 2B. In each of these alternative embodiments and in FIG. 2B, the seal that can block plasma (e.g., a fluorine cleaning plasma) is created at the end of the tube through which the shaft can move, such at the top of the tube 210 in FIG. 2B through which the shaft 220 can move.

In FIG. 2B, additional detail is also shown on the bendable portions 240A, 240B. The bendable portions 240A, 240B each include a first section 241, a second section 242, and a third section 243. The third section 243 connects the first section 241 with the second section 242. The first section 241 and the second section 242 can be vertical or substantially vertical (e.g., within 5 degrees of completely vertical). Furthermore, in some embodiments the first section 241 and the second section 242 can be completely straight or substantially straight with no significant bends or curves. The third section 243 can have a curved shape. In some embodiments, the third section 243 has a radius of curvature from about 0.25 inches to about 2.0 inches, such as from about 0.5 inches to about 1.2 inches. In some embodiments, the bendable portions 240A, 240B each consist of the first section 241, the second section 242, and the third section 243 in which the first section 241 and the second section 242 are straight, and the third section 243 can be defined by a single radius of curvature.

With additional reference to FIG. 2A, the first sections 241 of each of the bendable portions 240A, 240B are connected to the substrate support 150. For example, with reference to FIG. 2A and FIG. 2B, the first section 241 of the first bendable portion 240A is connected to the first extension 151 of the substrate support 150. Similarly, the first section 241 of the second bendable portion 240B is connected to the second extension 152 of the substrate support 150. The second sections 242 of each of the bendable portions 240A, 240B are connected to the shaft 220 through the contactor 230.

The first section 241 can move relative to the second section 242 during operation. For example, as the substrate support 150 is raised and the contactor 230 is pressed against the ledge 124 (see FIG. 1A), the first section 241 moves upward relative to the second section 242 because the compression of the spring 280 causes the second section to move downward relative to the first section 241. Similarly, when the substrate support 150 is lowered from the position in FIG. 1A to the position in FIG. 1B, the pressure on the contactor 230 against the ledge 124 is lowered until the contactor 230 no longer contacts the ledge 124 resulting in the second section 242 moving upwards relative to the first section 241.

In some embodiments, the bendable portions 240A, 240B can be formed of a conductor, such as a conductive metal (e.g., aluminum) or a material coated with a metal (e.g., aluminum), or an alloy (e.g., an aluminum-containing alloy). In some embodiments, the bendable portions 240A, 240B can have a total length (i.e., if folded to be flat) from about 3.0 inches to about 11.0 inches, such as from about 5.0 inches to about 9.0 inches, such as about 7.0 inches.

The bendable portions 240A, 240B can deform when the spring 280 extends and retracts. In some embodiments, the bendable portions 240A, 240B can deform in the plus and minus X-directions. Due to this deformation in the X-directions, the lower portion of the side surfaces of the mounting plates 270 (e.g., surface 270A) and legs 231, 232 (e.g., surface 231A) that face the bendable portions 240A, 240B can be angled away from a vertical direction. For example, these surfaces can be angled away at an angle from about 1.0 degrees to about 12.0 degrees relative to vertical, such as from about 3.0 degrees to about 9.0 degrees relative to vertical, such as about 5.0 degrees relative to vertical. This angle of the lower side surface of the mounting plates 270 and legs 231, 232 can allow the bendable portions 240A, 240B to deform, which reduces the stress on the bendable portions 240 that would occur if the side surfaces of the bendable portions 240A, 240B were entirely straight. In some embodiments, lower portions of the side surfaces of the extensions 151, 152 (see FIG. 2A) that face the bendable portions 240A, 240B can also include a similar angle to reduce stress caused by deformation of the bendable portions 240A, 240B. In some embodiments, the extensions 151, 152 and legs 231, 232 may not extend as far down as the mounting plates 270 in the vertical direction, so that these components are less likely to increase stress caused by deformation when the corresponding bendable portion 240A, 240B deforms towards the respective extension 151, 152 or leg 231, 232.

The bendable portions 240A, 240B can be described as having a J-shape for their resemblance to the letter J, such as the capital letter J in "Arial" font. This shape has been found to result in a lower amount of stress being placed on the bendable portion 240A, 240B than bendable portions having different shapes when stress is placed on the bendable portions, for example when the shaft 220 slides into and out of the tube 210. With the lower stress being placed on the bendable portions 240A, 240B, the lifetime of the bendable portions 240A, 240B can be extended which results in a reduction in downtime for maintenance related to the bendable portions.

In FIG. 2B, additional detail is also shown for the contactor 230 as well as for the connection of the contactor 230 to the shaft 220. The contactor 230 can further include a protrusion 238. The protrusion 238 is configured to fit into the recess 224 of the shaft 220. The protrusion 238 is positioned between the first leg 231 and the second leg 232. The protrusion extends from the top in the first direction (i.e., downwardly in FIG. 2B). The protrusion 238 can includes three or more side surfaces (e.g., four are shown in FIG. 2C below) extending in the first direction. In some of these embodiments, at least one of the side surfaces is flat and at least one of the side surfaces is curved to assist in preventing rotation of the contactor 230 as described in more detail below.

The elevated portion 235 and/or the protrusion 238 can be located in a central position on the top 233 of the contactor 230, which can help prevent the contactor 230 from rotating, tilting, or reduce the amount of rotation or tilting of the contactor 230 that may occur. For example, in some embodiments the elevated portion 235 and the protrusion 238 can be centered around a location that is equidistant from the first leg 231 and the second leg 232.

As shown, the contactor 230 can be fastened to the shaft 220 using a fastener 236. The fastener 236 can extend through an opening 237 of the contactor 230. The opening 237 can extend through the elevated portion 235, the top 233, and the protrusion 238. The opening 237 can include an upper region and a lower region. The upper region can have a larger cross-section area in the XY plane than the lower region. The larger upper region can be used to retain the head of the fastener 236. The lower region can be used to receive the threaded portion of the fastener 236, so that the fastener 236 can be threaded into corresponding threaded opening 229 located at a top of the shaft 220.

In some embodiments, the fastener 236 can be positioned to not contact any of the surfaces of the contactor 230. This non-contact positioning can enable the contactor 230 to make small movements without contacting fastener 236. Furthermore, this non-contact positioning can reduce the amount of stress placed on the fastener 236 when the contactor 230 tilts a few degrees, for example when a top surface of the first leg 231 is higher than a top surface of the second leg 232. This reduction in stress on the fastener 236 can extend the useful life of the fastener 236 and reduce downtime related to replacement of the fastener 236.

In some embodiments, electrical connector 200 further includes one or more rollers 275 connected to the shaft 220. The rollers 275 can be a closest movable component inside the tube 210 to the interior wall of the tube body 212. As shown in FIG. 2B, the shaft 220 is oriented in a vertical direction. If the shaft 220 tilts in any direction away from this vertical orientation, then the one or more rollers 275 can generally be the first and only component to make contact with the interior wall of the tube body 212, which can enable the shaft 220 to move vertically, for example when the spring 280 extends or retracts.

FIG. 2C is a cross-sectional top view of the components in the electrical connector 200 along reference line 2C from FIG. 2B, according to one embodiment. Referring to FIG. 2B, the contactor 230 is positioned in a recess 224 of the first portion 221 of the shaft 220. Referring back to the top view of FIG. 2C, the recess 224 has a non-circular shape (i.e., a shape represented by the sidewalls of the recess 224) when viewed from above. This non-circular shape can include one or more straight sidewalls. For example, the recess 224 includes a first straight sidewall 224A and a second straight sidewall 224B to give the recess 224 a non-circular shape. Although not separately labeled in FIG. 2C for ease of illustration, the protrusion 238 can include straight sidewalls that correspond to the straight sidewalls (e.g., sidewalls 224A, 224B) of the recess 224. For example, the protrusion 238 can include straight sidewalls facing the straight side walls 224A, 224B of the recess, and the protrusion 238 can include curved sidewalls facing the curved sidewalls of the recess 224.

These straight sidewalls of the recess 224 and the protrusion 238 can help prevent rotation of the contactor 230 about a vertical axis (e.g., Z-axis), which can cause torsion on the bendable portions 240A, 240B. When this torsion on the bendable portions 240A, 240B can be reduced or eliminated, the useful life of the bendable portions 240A, 240B can be increased. Also, the curved sidewalls have a different (e.g., longer length in the XY-plane than the straight sidewalls 224A, 224B which can further assist in prevent rotation of the contactor 230.

As mentioned above, there can be a gap between the fastener 236 and the contactor 230 to allow for a little movement of the contactor 230 relative to the fastener 236. This gap is not shown in FIG. 2C for ease of illustration. Similarly, there can be a slight gap between the sidewalls of the recess 224 and the contactor 230, but this gap is also not shown here for ease of illustration. The straight sidewalls of the recess 224 and the protrusion 238 is one method of preventing rotation of the contactor 230 and other methods may also be used. For example, in one embodiment, the protrusion 238 can include a key extending outward in the XY plane from the rest of the protrusion 238, and the recess 224 can include a corresponding keyway to receive the key of the protrusion 238.

Figure 3A:
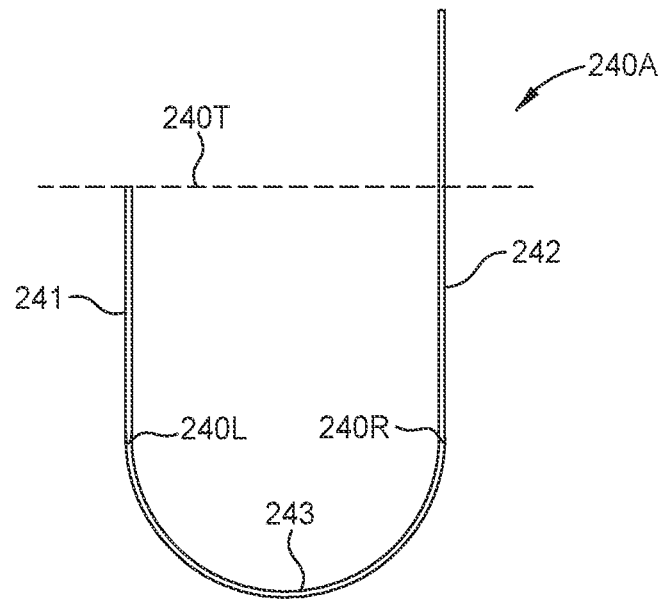
FIG. 3A is a side view of the bendable portion shown in FIGS. 2A and 2B, according to one embodiment.

FIG. 3A is a side view of the bendable portion 240A shown in FIGS. 2A and 2B, according to one embodiment. In FIG. 3A, the bendable portion 240A is shown unattached to any other components, so that the shape of bendable portion 240A before any stress is placed on the bendable portion 240A can be described. As mentioned above, the bendable portion 240A can have a J-shape. The bendable portion 240A includes the first section 241, the second section 242, and the third section 243 that connects the first section 241 with the second section 242. Although not required, the first section 241 and the second section 242 can be straight in some embodiments. The second section 242 is longer than the first portion as shown by the extension of the second section 242 above the top horizontal line 240T. The first section 241 extends from a top-left end of the bendable portion 240A to a left-side location 240L where the bendable portion 240A begins to curve. The second section 242 extends from a top-right end of the bendable portion 240A to a right-side location 240R where the bendable portion 240A begins to curve.

Figure 3B:
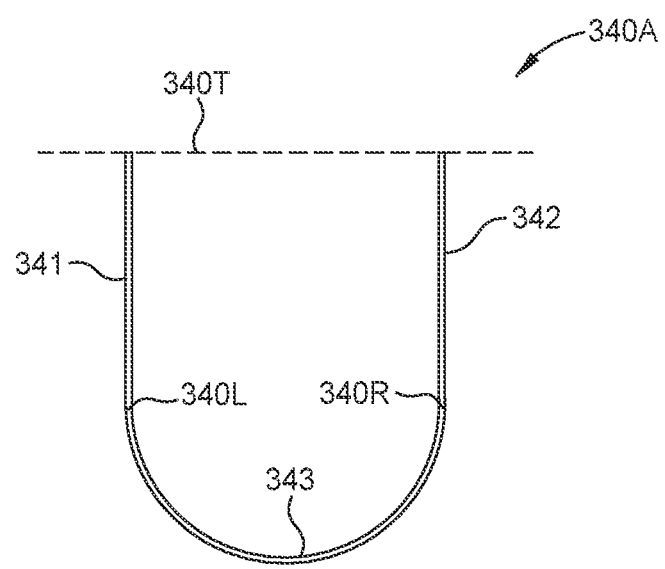
FIG. 3B is a side view of a bendable portion, according to another embodiment.

FIG. 3B is a side view of a bendable portion 340A, according to another embodiment. In FIG. 3B, the bendable portion 340A is shown unattached to any other components, so that the shape of bendable portion 340A before any stress is placed on the bendable portion 340A can be described. The bendable portion 340A is the same as the bendable portion 340AB described above except that the bendable portion 340A has a U-shape as opposed to the J-shape of the bendable portion 240A. For example, the bendable portion 340A can have a shape of the letter U, such as the capital letter U in "Arial" font.

The bendable portion 340A can include a first section 341, a second section 342, and a third section 343. The third section 343 connects the first section 341 with the second section 342. Although not required, the first section 341 and the second section 342 can be straight in some embodiments. The second section 342 is a same length as the first section 341 as shown by the extension of the first section 341 and the second section 342 to the top horizontal line 340T. The first section 341 extends from a top-left end of the bendable portion 340A to a left-side location 340L where the bendable portion 340A begins to curve. The second section 342 extends from a top-right end of the bendable portion 340A to a right-side location 340R where the bendable portion 340A begins to curve.

The third section 343 can have a curved shape. In some embodiments, the third section 343 has a radius of curvature in the ranges described above for the third section 243. In some embodiments, the bendable portion 340 consists of the first section 341, the second section 341, and the third section 343 in which the first section 341 and the second section 342 are straight, and the third section 343 can be defined by a single radius of curvature.

Even though the bendable portions 240A and 340A are described in reference to FIGS. 2A and 3B as having a J-shape and a U-shape respectively when these components are unattached to any other components, the shape of these components can change when attached to the substrate support 150 and the contactor 230 as shown in FIG. 2B, and the substrate support 150 is moved. For example, in some embodiments, when attached to the substrate support 150 and contactor 230, in some embodiments the bendable portions (e.g., bendable portion 240A or bendable portion 340A) can be configured to have a J-shape or a U-shape when the substrate support 150 is in the position shown in FIG. 1B and a U-shape or J-shape when the substrate support 150 is in the position shown in FIG. 1A, such that the shape of each bendable portion 240A, 340A changes from being J-shape to U-shape or vice versa when the substrate support 150 is moved.

The use of J-shaped bendable portions (e.g., bendable portion 240A) and U-shaped bendable portions (e.g., bendable portion 340A) has resulted in a substantial reduction in the amount of stress placed on previous conductors used to make a similar electrical connection when a substrate support (e.g., substrate support 150) is moved. The reduction of stress in some embodiments has been greater than 25%, such as even greater than 50% relative to the stress placed on other conductors having different shapes. This reduction in stress allows the bendable portions 240A, 340A to have a longer useful life than bendable portions having different shapes. In some embodiments, a maximum amount of stress placed on the bendable portions 240A, 340A during a full stroke of the spring 280 (see FIG. 2B) can be from about 30 MPa to about 130 MPa, such as from about 50 MPa to about 80 MPa, such as about 60 MPa.

While the foregoing is directed to embodiments of the present disclosure, other and further embodiments of the disclosure may be devised without departing from the basic scope thereof, and the scope thereof is determined by the claims that follow.

What is claimed is:

1. A process kit, comprising:
a substrate support; and
one or more electrical connectors, each of the one or more electrical connectors attached to the substrate support, each of the one or more electrical connectors comprising:
    a tube;
    a shaft including a first portion, a second portion, and a rim, the rim positioned inside the tube, the first portion above the rim and the second portion below the rim, wherein at least part of the first portion is configured to move outside of the tube, and the second portion is inside the tube; and
    a first bendable portion including a first section and a second section, wherein:
        the first section and the second section are substantially vertical,
        the first section is connected to the substrate support, and the second section is connected to the shaft, and
        the first section is configured to move relative to the second section when the shaft moves relative to the substrate support; and
    a seal, wherein the rim directly underlies at least a portion of the seal.

2. The process kit of claim 1, wherein the rim is configured to contact the seal.

3. The process kit of claim 1, further comprising a second bendable portion including a third section and fourth section, wherein the third section is connected to the substrate support and the first third section is connected to the shaft.

4. The process kit of claim 1, wherein each of the one or more electrical connectors further comprises a spring disposed inside the tube, the spring configured to move the shaft upwards to a first position when a downward pressure on the shaft is removed.

5. The process kit of claim 4, wherein the rim is configured to contact the seal when the shaft is in the first position.

6. The process kit of claim 5, wherein the rim contacts the seal around 360 degrees when the shaft is in the first position.

7. The process kit of claim 1, wherein the tube includes a bottom portion that is sealed.

8. The process kit of claim 1, wherein
the substrate support includes a top surface for supporting a substrate, a bottom surface, and one or more sidewalls connecting the top surface to the bottom surface, and
the one or more electrical connectors are each attached to one of the one or more sidewalls of the substrate support.

9. A process kit, comprising:
a substrate support; and
one or more electrical connectors, each of the one or more electrical connectors attached to the substrate support, each of the one or more electrical connectors comprising:
    a tube;
    a shaft including a first portion and a second portion, wherein the first portion is outside of the tube and the second portion is inside the tube; and
    a bendable portion including a first section and a second section, wherein:
        the first section and the second section are substantially vertical,
        the first section is connected to the substrate support and the second section is connected to the shaft, and
        the first section is configured to move relative to the second section when the shaft moves relative to the substrate support.

10. The process kit of claim 9, wherein the bendable portion has a J-shape.

11. The process kit of claim 9, wherein the bendable portion has a U-shape.

12. The process kit of claim 9, wherein the bendable portion further comprises a third section that connects the first section to the second section.

13. The process kit of claim 12, wherein the third section is curved.

14. The process kit of claim 12, wherein the third section is curved, and the third section has a radius of curvature from about 0.5 inches to about 1.2 inches.

15. The process kit of claim 14, wherein the first bendable portion consists of the first section, the second section, and the third section.

16. The process kit of claim 9, wherein each of the one or more electrical connectors further comprises a spring disposed inside the tube, the spring configured to move the shaft and the first section of the bendable portion upwards when a downward pressure on the shaft is removed.

17. The process kit of claim 9, wherein:
the substrate support includes a top surface for supporting a substrate, a bottom surface, and one or more sidewalls connecting the top surface to the bottom surface, and
the one or more electrical connectors are each attached to one of the one or more sidewalls of the substrate support.

* * * * *